United States Patent
Cukur et al.

(10) Patent No.: US 7,449,884 B1
(45) Date of Patent: Nov. 11, 2008

(54) ENHANCED SPECTRAL SELECTIVITY FOR STEADY-STATE FREE PRECESSION IMAGING

(75) Inventors: Tolga Cukur, Stanford, CA (US); Dwight G. Nishimura, Palo Alto, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 7 days.

(21) Appl. No.: 11/800,419

(22) Filed: May 4, 2007

(51) Int. Cl.
*G01V 3/00* (2006.01)
(52) U.S. Cl. .......................... 324/307; 324/309; 324/312
(58) Field of Classification Search ................. 324/307, 324/309, 312
See application file for complete search history.

(56) References Cited

U.S. PATENT DOCUMENTS

| | | | |
|---|---|---|---|
| 5,170,122 A | 12/1992 | Bernstein | |
| 6,307,368 B1 | 10/2001 | Vasanawala | |
| 6,586,933 B1 | 7/2003 | Hardy et al. | |
| 6,714,807 B2 | 3/2004 | Zur | |
| 6,750,651 B2 | 6/2004 | Overall | |
| 6,906,516 B2 * | 6/2005 | Bangerter et al. | 324/309 |
| 7,187,170 B1 * | 3/2007 | Hargreaves et al. | 324/307 |
| 7,230,423 B2 * | 6/2007 | Deimling | 324/307 |
| 7,253,620 B1 * | 8/2007 | Derbyshire et al. | 324/307 |
| 7,332,908 B2 * | 2/2008 | Nayak et al. | 324/307 |

OTHER PUBLICATIONS

Vasanawala et al., "Linear combination steady-state free precession MRI", Magn Reson Med, 2000; 43:82-90.
Ty et al., "Fat and Water Separation In Balanced Steady-State Free Precession Using The Dixon Method", Magn Reson Med, 2004; 51:243-247.

* cited by examiner

*Primary Examiner*—Louis M Arana
(74) *Attorney, Agent, or Firm*—Beyer Law Group LLP

(57) ABSTRACT

A method of collecting image data with selective spectral suppression for at least two species is provided. A sequence of RF excitation pulses is repeatedly applied, whereby a repeated sequence of at least two substantially different spectrally selective steady-state magnetizations is established. Magnetic gradients are applied between said RF pulses. A plurality of magnetic resonance image (MRI) signals is acquired. The plurality of MRI signals is combined using a weighted combination where the weights depend on a control parameter that adjusts a trade-off between selective spectral suppression and signal-to-noise ratio (SNR).

19 Claims, 9 Drawing Sheets

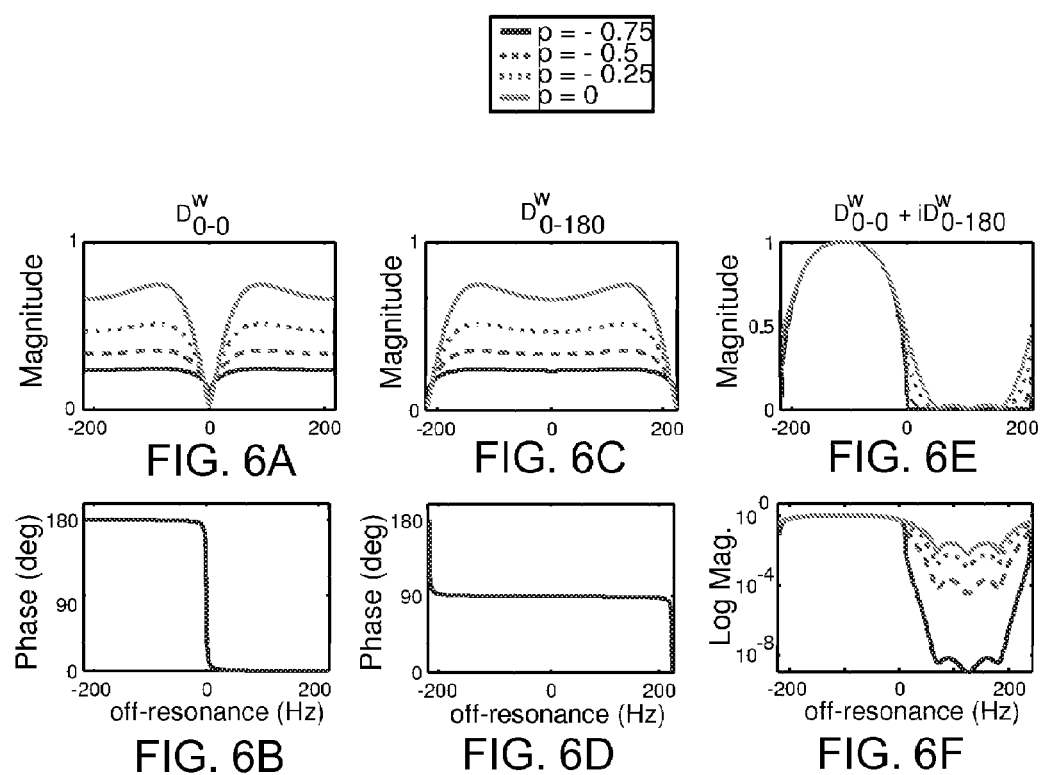

ENHANCED SPECTRAL SELECTIVITY FOR STEADY-STATE FREE PRECESSION IMAGING

GOVERNMENT RIGHTS

The U.S. government has rights in the disclosed invention pursuant to NIH grants to Stanford University including 5R01_HL075803, and 5R01_HL039297.

BACKGROUND OF THE INVENTION

This invention relates generally to magnetic resonance imaging (MRI), and more particularly the invention relates to MRI using steady-state free precession (SSFP) with image artifact reduction.

Magnetic resonance imaging (MRI) is a non-destructive method for the analysis of materials and represents a new approach to medical imaging. It is generally non-invasive and does not involve ionizing radiation. In very general terms, nuclear magnetic moments are excited at specific spin precession frequencies which are proportional to the local magnetic field. The radio-frequency signals resulting from the precession of these spins are received using pickup coils. By manipulating the magnetic fields, an array of signals is provided representing different regions of the volume. These are combined to produce a volumetric image of the nuclear spin density of the body.

Magnetic resonance (MR) imaging is based on nuclear spins, which can be viewed as vectors in a three-dimensional space. During a MR experiment, each nuclear spin responds to four different effects—precession about the main magnetic field, nutation about an axis perpendicular to the main field, and both transverse and longitudinal relaxation. In steady-state MR experiments, a combination of these effects occurs periodically.

Balanced steady-state free precession (SSFP) sequences have gained popularity in magnetic resonance imaging (MRI) as they can yield high signal-to-noise ratios (SNR) within very short scan times. It is necessary to suppress the fat signal in applications where the tissue of interest has a comparable or smaller signal than fat, including coronary artery imaging, cartilage imaging and flow-independent angiography. There are various methods for suppression; one common way of reducing the fat signal in SSFP is to shape the periodic frequency response such that a broad range of frequencies around the resonant frequency of lipid are selectively masked out. Examples of this group of methods include fluctuating equilibrium magnetic resonance (FEMR), linear combination SSFP (LC-SSFP), binomial excitation patterns, periodic flip angle variations, and fat suppressing alternating TR (FS-ATR) SSFP.

A drawback of these methods is the wedge shape of the stop-bands. The relatively broad stop-bands fail to yield suppression over certain ranges of frequencies, leading to a residual fat signal comparable to the water signal. Consequently, moderate to large resonant frequency variations will compromise the robustness of fat suppression.

SUMMARY OF THE INVENTION

In accordance with the invention, a method of collecting image data with selective spectral suppression for at least two species is provided. A sequence of RF excitation pulses with a certain phase progression is applied at a repetition rate to give an SSFP image, in which a spectrally dependent steady-state magnetization is established. Magnetic gradients are applied between said RF pulses. The sequence of RF excitation pulses is repeated with different phase progressions to give a plurality of SSFP images, in which a different spectrally dependent steady-state magnetization is established for each SSFP image. The plurality of SSFP images is combined using a weighted combination in which the weights depend on a control parameter that adjusts a trade-off between selective spectral suppression and signal-to-noise ratio (SNR).

In another manifestation of the invention a method is provided that repeatedly applies a sequence of RF excitation pulses with a phase progression at a repetition rate, which provides an SSFP image in which a spectrally dependent steady-state magnetization is established. Magnetic gradients are applied between said RF excitation pulses. A plurality of steady-state free procession SSFP images is acquired with different RF phase increments of an object to be imaged. The plurality of SSFP images is combined using a weighted combination using a weighting according to the equations $$Y_1 = \||D_{0-0}|^p D_{0-0} + i|D_{0-180}|^p D_{0-180}\|^{\frac{1}{1+p}}$$

$$Y_2 = \||D_{0-0}|^p D_{0-0} - i|D_{0-180}|^p D_{0-180}\|^{\frac{1}{1+p}}$$

wherein $Y_1$ is an image for a first species and $Y_2$ is an image for a second species, $D_{0-0}$ is a data set based on consecutive RF pulses that are all in phase and $D_{0-180}$ is a data set based on consecutive RF pulses that are all out of phase and p is a real number in the range $(-1, 0)$, where p is a control parameter. The combined plurality of SSFP images is displayed.

In another manifestation of the invention an apparatus, comprising a magnet system and a controller electrically connected to the magnet system is provided. The controller comprises a display, at least one processor, and computer readable media. The computer readable media comprises computer readable code for acquiring a plurality of SSFP images with different RF phase increments of an object to be imaged and computer readable code for combining the plurality of SSFP images using a weighted combination in which the weights depend on a control parameter that adjusts a trade-off between selective spectral suppression and signal-to-noise ratio (SNR).

The invention and objects and features thereof will be more readily apparent from the following detailed description and appended claims when taken with the drawings.

BRIEF DESCRIPTION OF THE DRAWINGS

FIGS. 6A-F show magnitude and phase spectra SSFP datasets.

DETAILED DESCRIPTION OF ILLUSTRATED EMBODIMENTS

Figure 1A:
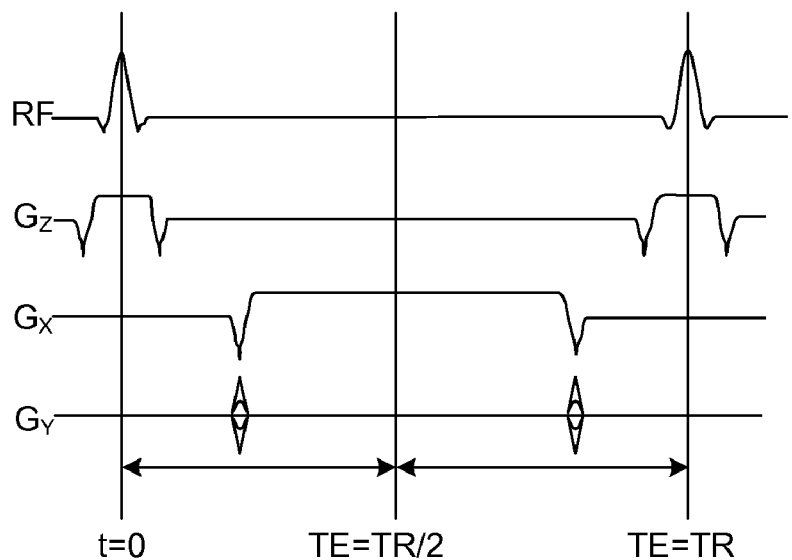
FIGS. 1A, 1B illustrate a SSFP phase sequence.
Figure 1B:
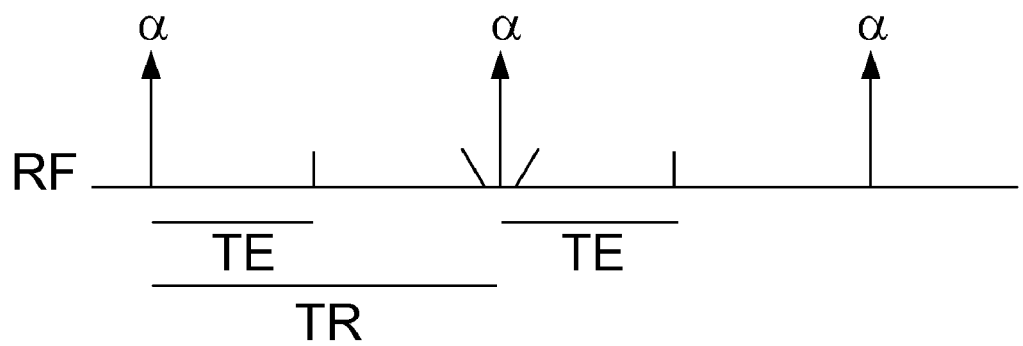

As illustrated in FIGS. 1A, 1B, a refocused SSFP sequence includes a single RF excitation which is repeated periodically. All gradients used for slice selection or imaging are fully rewound over each repetitive time, TR. In the steady-state, the magnetization at points a and d are the same.

Magnetization is tipped about a traverse axis through an angle α. Between excitations, the magnetization undergoes a precession by an angle $\theta = 2\pi \Delta f TR$ about the z-axis (direction of $B_0$), where $\Delta f$ is the tissue off-resonance, and also experiences both T1 and T2 relaxation.

During the sequence each spin is affected by RF pulses, relaxation and free precession. The steady-state magnetization for SSFP is a function of the sequence parameters flip angle (α), repetition time (TR) and echo time (TE) as well as the tissue parameters T1, T2, and resonant frequency shift $\Delta f$.

Figure 2:
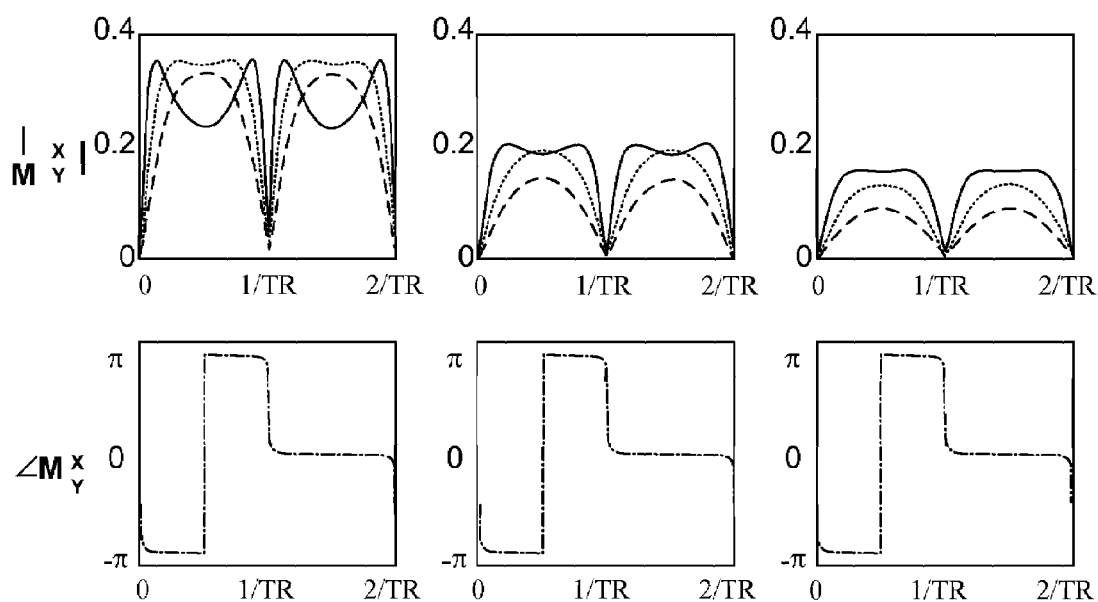
FIG. 2 illustrates SSFP transverse magnetization and phase as a function of off-resonance frequency for a SSFP signal profile.

Signal readout is performed each period, with low spatial frequency information acquired at an echo time TE typically spaced midway between the RF excitation pulses. The resultant steady-state MR signal is a strong function of the local resonant frequency, as shown in FIG. 2, which shows magnetization or signal profiles (i.e., off-resonance spectra). SSFP transverse magnetization magnitude (top) and phase (bottom) are shown as a function of off-resonant frequency. Each graph shows three different tip angles: the solid line corresponds to a 30° tip angle, the dotted line 60°, and the dashed line 90°. Profiles are shown for three different T1/T2 combinations: T1/T2=200/100 ms (left), T1/T2=600/100 ms (middle), and T1/T2=1000/100 ms (right). TE=TR/2 in all cases. The periodic nulls in the signal profile, separated by a frequency of 1/TR, are the source of off-resonance banding artifacts.

The SSFP signal is a function of free precession per TR (ω) and the spectrum displays $2\pi$-periodic (in ω) nulls. There are $\pi$ radians phase jumps across these nulls. Furthermore, a constant RF phase increment ($\Delta\phi$) employed from one excitation to the next shifts the SSFP spectrum by ($\Delta\phi$) in the ω-axis. Multiple-acquisition methods shape the SSFP profile by exploiting these characteristics of the SSFP signal.

The LC-SSFP method produces a stop-band centered at the fat-resonance by combining two phase-cycled SSFP acquisitions. See Vasanawala et al., Magn. Reson. Med. 2000; 43: 82-90. The two combined magnetization profiles are out-of-phase in the vicinity of fat-resonance. Consequently, the two profiles are subtracted from each other. Since the magnitudes of the subtracted profiles are not the same for all frequencies, there is residual stop-band signal in the final image. The performance of the LC-SSFP method degrades at higher flip angles and when the tissue sample has a relatively low T1/T2 ratio.

A novel SSFP combination method (weighted-combination or WC-SSFP) for improved fat suppression is provided. Weighting SSFP datasets by a negative power (between −1 and 0) of their magnitudes and combining them as in LC-SSFP achieves a drastic improvement in suppression robustness without affecting the pass-band. The range of flip angles and T1/T2 ratios for which LC-SSFP works robustly are expanded. The level of stop-band suppression can be adjusted through the power control parameter to meet application-specific needs. 2D and 3D fat- or water-suppressed SSFP imaging in the presence of large off-resonant frequency variations and at higher resolutions can be successfully accomplished with this method.

Figure 3:
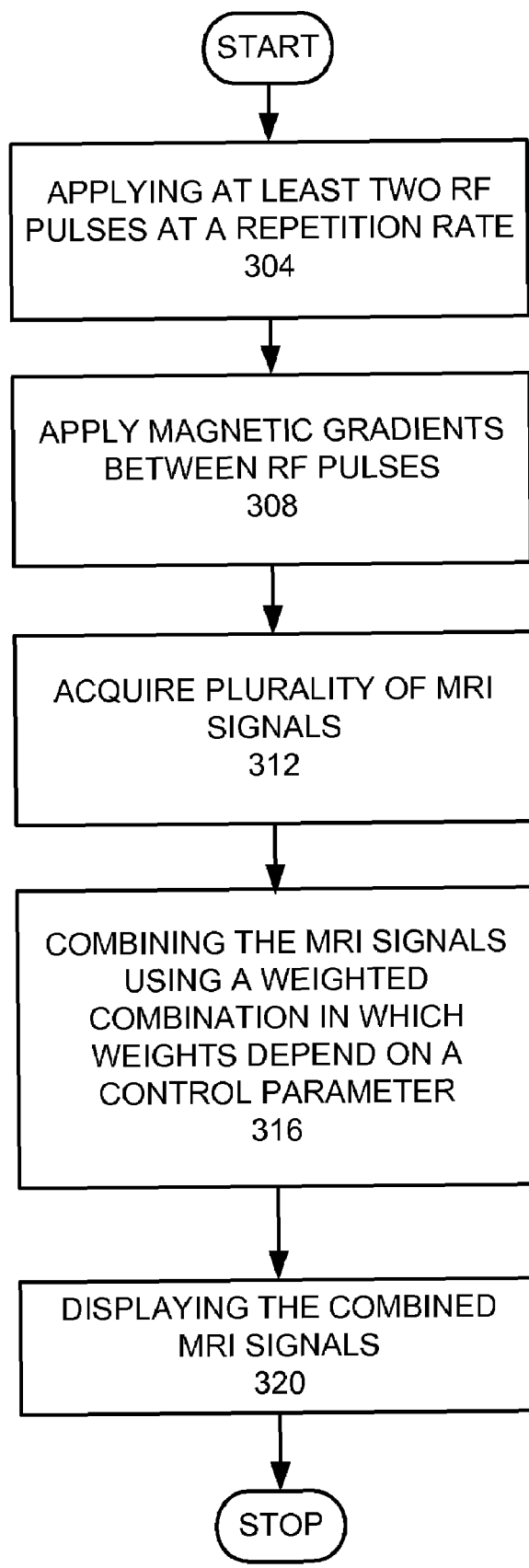
FIG. 3 is a high level flow chart of an embodiment of the invention.

FIG. 3 is a high level flow chart of an embodiment of the invention. At least two RF excitation pulses are repeatedly applied at a repetition rate, whereby at least two substantially different spectrally selective steady-state magnetizations are established (step 304). Magnetic gradients are applied between RF pulses (step 308). A plurality of MRI signals is acquired during the time that the magnetic gradients are applied (step 312). The MRI signals are combined using a weighted combination in which the weights depend on a control parameter that adjusts selective spectral suppression to SNR (step 316). The combined MRI signals are displayed (step 320).

EXAMPLES

Figure 4:
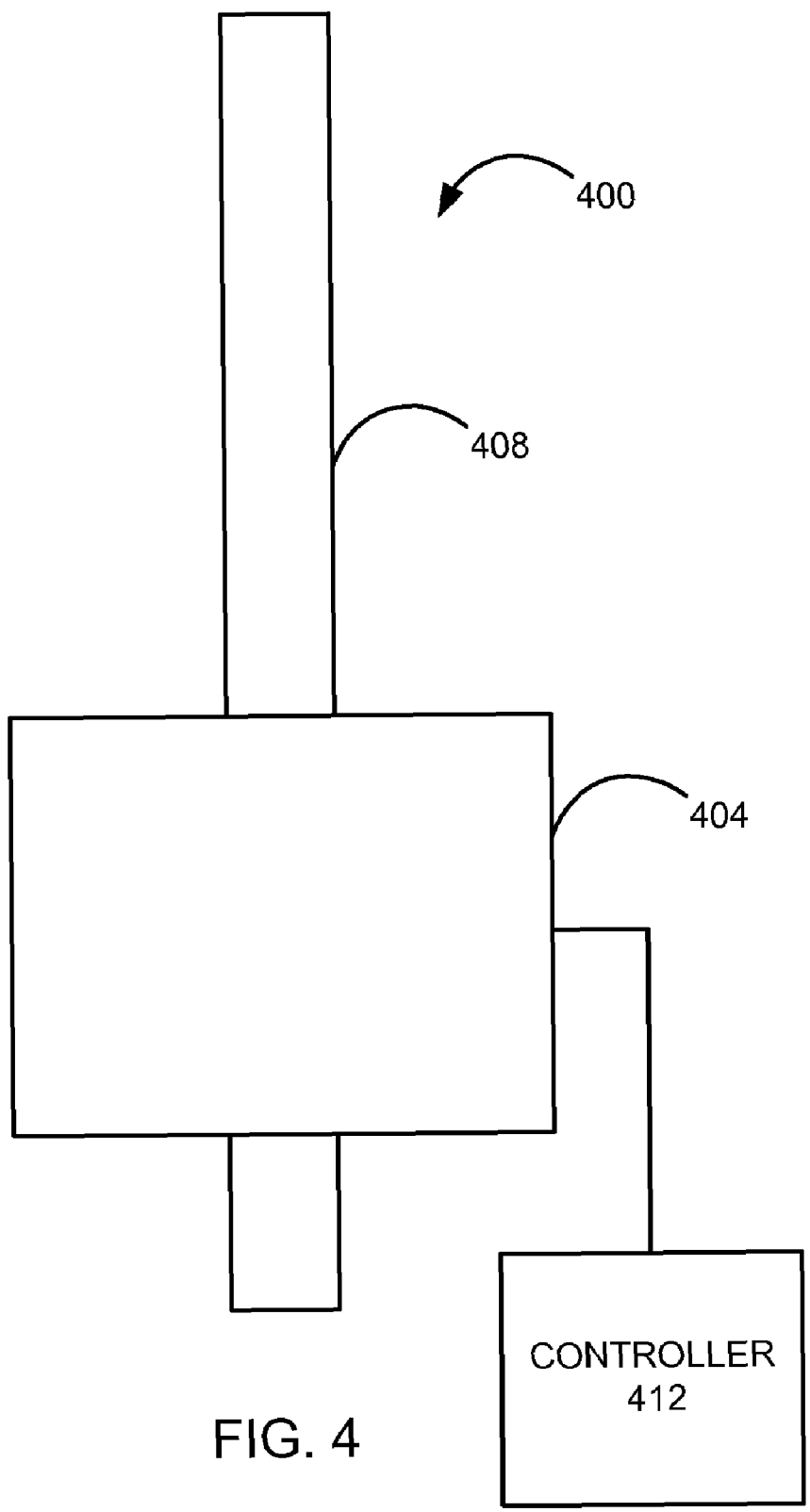
FIG. 4 is a schematic top view of a magnetic resonance imaging (MRI) system that may be used in an embodiment of the invention.

FIG. 4 is a schematic top view of a magnetic resonance imaging (MRI) system 400 that may be used in an embodiment of the invention. The MRI system 400 comprises a magnet system 404, a patient transport table 408 connected to the magnet system, and a controller 412 controllably connected to the magnet system. In one example, a patient would lie on the patient transport table 408 and the magnet system 404 would pass around the patient. The controller 412 would control magnetic fields and radio frequency (RF) signals provided by the magnet system 404 and would receive signals from detectors in the magnet system 404.

Figure 5A:
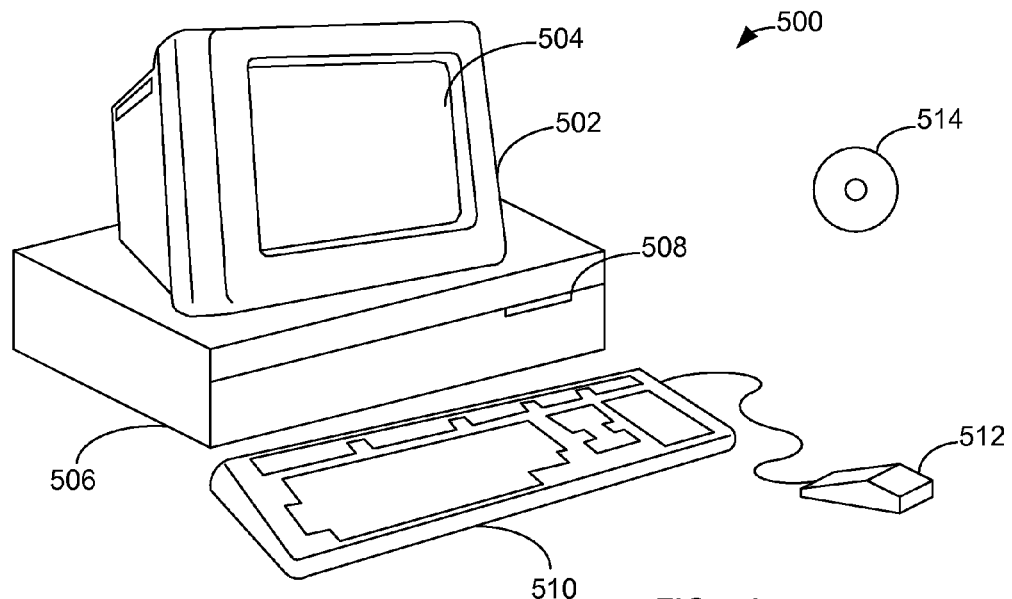
FIGS. 5A and 5B illustrate a computer system that may be used in an embodiment of the invention.
Figure 5B:
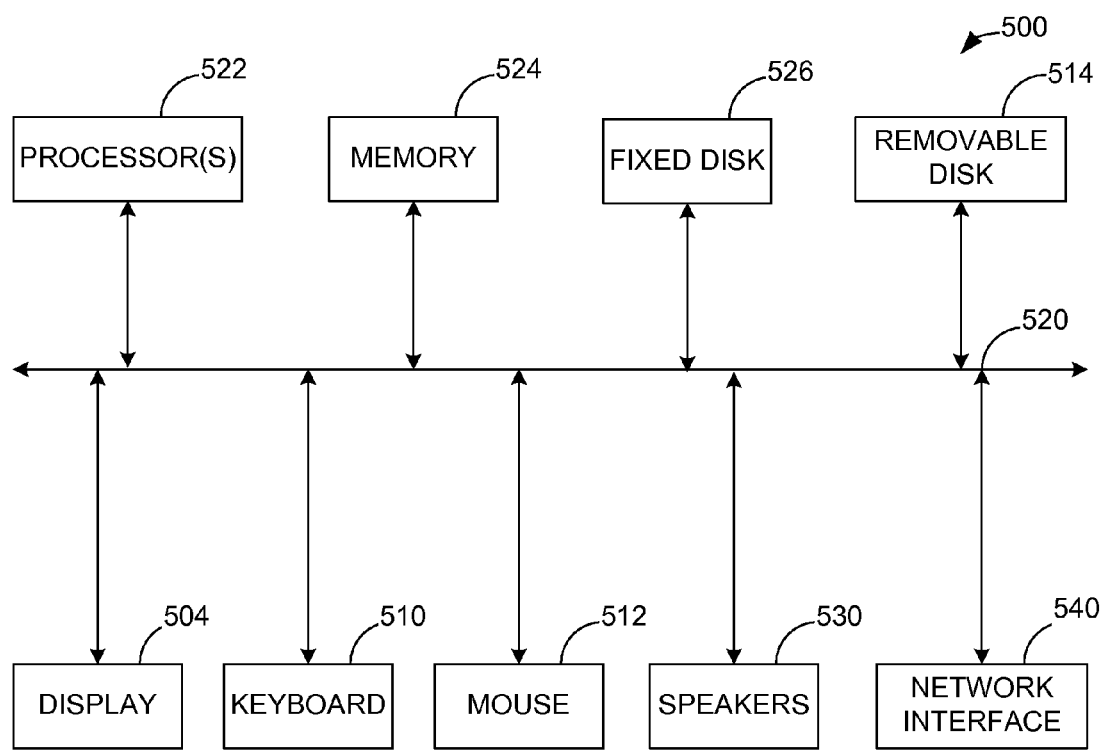

FIGS. 5A and 5B illustrate a computer system 500, which is suitable for implementing a controller 412 used in embodiments of the present invention. FIG. 5A shows one possible physical form of the computer system. Of course, the computer system may have many physical forms ranging from an integrated circuit, a printed circuit board, and a small handheld device up to a huge super computer. Computer system 500 includes a monitor 502, a display 504, a housing 506, a disk drive 508, a keyboard 510, and a mouse 512. Disk 514 is a computer-readable medium used to transfer data to and from computer system 500.

FIG. 5B is an example of a block diagram for computer system 500. Attached to system bus 520 are a wide variety of subsystems. Processor(s) 522 (also referred to as central processing units, or CPUs) are coupled to storage devices, including memory 524. Memory 524 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 526 is also coupled bi-directionally to CPU 522; it provides additional data storage capacity and may also include any of the computer-readable media described below. Fixed disk 526 may be used to store programs, data, and the like and is typically a secondary storage medium (such as a hard disk) that is slower than primary storage. It will be appreciated that the information retained within fixed disk 526 may, in appropriate cases, be incorporated in standard fashion as virtual memory in memory 524. Removable disk 514 may take the form of the computer-readable media described below.

CPU 522 is also coupled to a variety of input/output devices, such as display 504, keyboard 510, mouse 512, and speakers 530. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 522 optionally may be coupled to another computer or telecommunications network using network interface 540. With such a network interface, it is contemplated that the CPU might receive information from the network, or might output information to the network in the course of performing the above-described method steps. Furthermore, method embodiments of the present invention may execute solely upon CPU 522 or may execute over a network such as the Internet in conjunction with a remote CPU that shares a portion of the processing.

In addition, embodiments of the present invention further relate to computer storage products with a computer-readable medium that has computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

In a more specific example, the above apparatus is used. The controller 412 signals the magnet system 404 to repeatedly apply RF excitation pulses to an object to be imaged in the magnet system 404 to establish at least two substantially different spectrally selective steady-state magnetizations (step 304). The controller 412 signals the magnetic system 404 to apply magnetic gradient between RF pulses (step 308). The controller 412 acquires a plurality of MRI signals during the time that the magnetic gradients are applied (step 312).

The controller 412 combines the plurality of MRI signals using a weighted combination in which the weights depend on a control parameter to adjust selective spectral suppression to SNR (step 316). An embodiment of the invention provides a weighted combination of the complex-valued MRI signals instead of a weighted combination of the magnitude MRI signals, in which the weights are based on the MRI signals themselves raised to a power and in which the power of the weight is a control parameter p.

The off-resonance dependence of the phase of the SSFP signal makes it feasible to create stop- and pass-bands through the linear combination of two phase-cycled images with different RF phase increments. By proper selection of TR (2.3 ms at 1.5 T), the separation between the centers of these two bands can be adjusted to match the fat/water frequency separation, approximately 217 Hz at 1.5 T. Therefore, fat and water images can be selectively reconstruct by swapping the stop- and pass-band locations.

In LC-SSFP (equivalently WC-SSFP for p=0), two SSFP datasets $D_{0-0}$ and $D_{0-180}$, with RF phase increments $\Delta\phi=0°$ and $180°$ respectively, are acquired. The phase difference between the data sets is $\pi/2$ radians for one-half of the spectral period and $-\pi/2$ radians for the other half as displayed in FIGS. 6A-D. The addition of a $\pi/2$ radians phase to the $D_{0-180}$ dataset makes the negative half of frequencies in-phase and the other half out-of-phase with the $D_{0-0}$ dataset. Therefore a summation of $D_{0-0}$ with the phase-shifted version of $D_{0-180}$ creates stop- and pass-bands. The transverse magnetization values in the two different spectra subtracted from each other are not equal due to the shape of the SSFP spectrum and the presence of signal nulls. Hence, the stop-band will display deviations from a perfect null for certain ranges of frequencies. For this reason, the reduced flatness of the SSFP spectrum with higher flip angles and lower T1/T2 ratios decreases the robustness of the fat-water separation in LC-SSFP.

The range of magnetization amplitudes observed with off-resonance frequency variation are reduced if the SSFP data set is weighted by its magnitude raised to a negative power p between −1 and 0 as shown in FIGS. 6A,C. If the difference in the magnitude of magnetization between the two data sets is decreased, then the stop-band will get closer to a perfect null. The magnitude of each signal can be raised to a power and used as a weighting factor before linearly combining the two. The resulting water image $Y_w$ and fat image $Y_f$ can be expressed as $$Y_w = \left\| |D_{0-0}|^p D_{0-0} + i|D_{0-180}|^p D_{0-180} \right\|^{\left(\frac{1}{1+p}\right)} \quad \text{Eq. 1}$$

$$Y_f = \left\| |D_{0-0}|^p D_{0-0} - i|D_{0-180}|^p D_{0-180} \right\|^{\left(\frac{1}{1+p}\right)} \quad \text{Eq. 2}$$

where p is the parameter adjusting the level of suppression and is to be varied in the range (−1, 0). The $$\left(\frac{1}{1+p}\right)^{th}$$

power of the combined image restores the original contrast that would be captured with the LC-SSFP method. The method is exactly equivalent to LC-SSFP for p=0. The stop-band suppression improves with decreasing values of the parameter as displayed in FIGS. 6E, F. However, the non-linearity of the operation increases as p approaches −1, potentially enhancing partial-volume effects. It is important to note that p=−1 is not feasible as it removes all tissue contrast irreversibly. FIGS. 6A-F show magnitude and phase spectra SSFP datasets after magnitude-to-a-power weighting ($D^w = |D|^p D$), with FIGS. 6A, B: 0-0 ($\Delta\phi=0$) and FIGS. 6C-D: 0-180 ($\Delta\phi=\pi$) phase cycling. The spectrum of the combined datasets corresponding to the water image is shown in FIG. 6E (linear) and FIG. 6F (logarithmic) scales for a range of p values. The improvement in the stop-band suppression as p decreased toward −1 can clearly be seen in FIG. 6F.

Figure 7A:
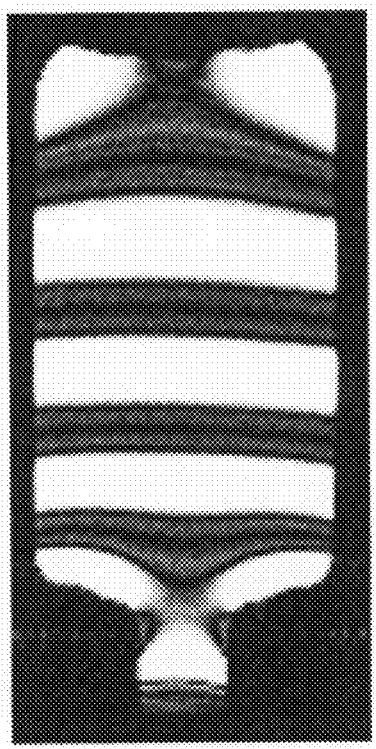
FIGS. 7A-B show a 3D SSFP acquisition of a water bottle accompanied with a linear shim gradient in the readout (vertical) direction to create bands.
Figure 7B:
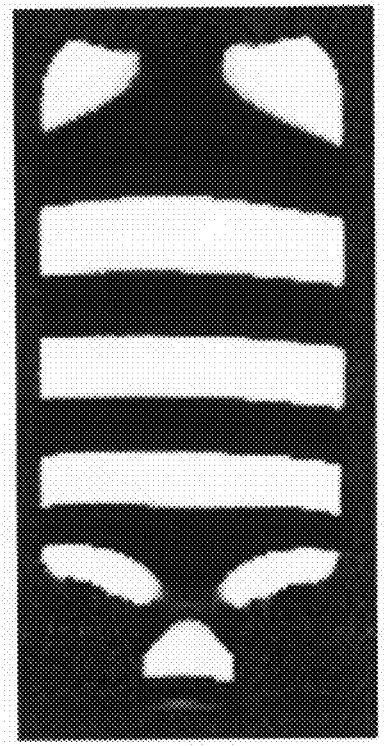

The effective stop-band suppression of the WC-SSFP method was demonstrated on a water phantom. A linear shim gradient in the readout direction was employed to simulate the off-resonance spectrum and create alternating pass- and stop-bands along the phantom. The images were acquired with a flip angle of 25° and a T1/T2=1300/900 ms phantom was used. While LC-SSFP images display some residual signal in the stop-bands, the remnant stop-band signal is almost completely suppressed with the WC method (p=−0.5). The results are shown in FIGS. 7A, B, which show a 3D SSFP acquisition of a water bottle accompanied with a linear shim gradient in the readout (vertical) direction to create bands. The LC-SSFP and WC-SSFP (p=−0.5) images shown in FIG. 7A and FIG. 7B respectively are identically windowed. The remnant stop-band signal depicted as gray regions in the LC-SSFP image appears dark in the WC-SSFP image due to improved suppression.

Figure 8:
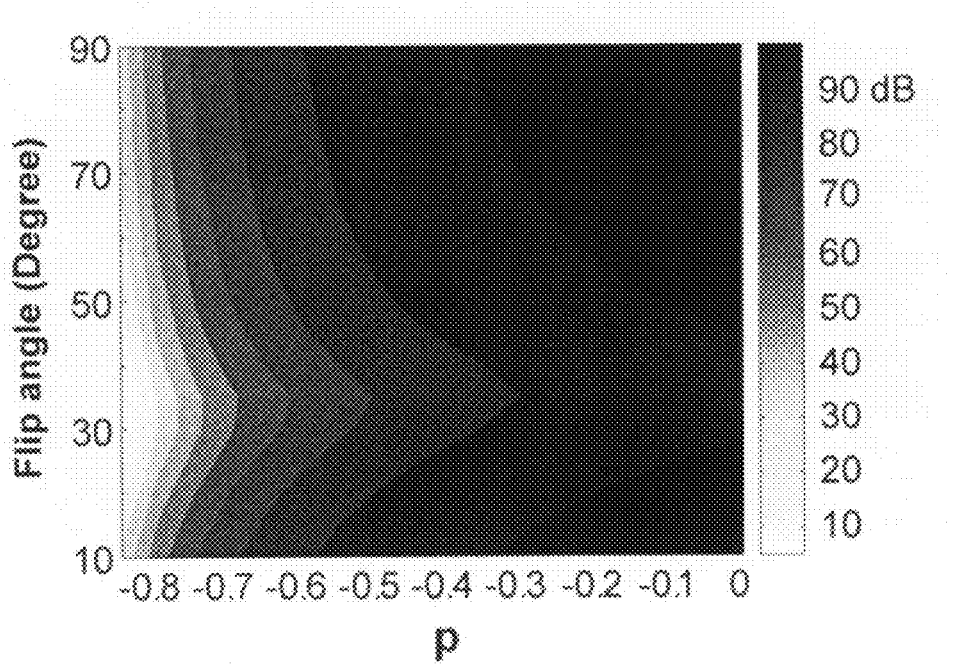
FIG. 8 shows a ratio computed for a range of flip angles and parameter p.

The improvement in stop-band suppression can be quantified by computing the ratio of the average water signal within a pass-band to the average fat signal within a stop-band. This ratio was computed for a range of flip angles and parameter p as shown in FIG. 8. The simulation parameters were: T1/T2=1000/100 ms for the water tissue, T1/T2=270/85 ms for the fat tissue, TR/TE=2.3/1.15 ms. The effective width of the stop-band at TR=2.3 ms is approximately 160 Hz. Therefore the pass-band was chosen to be the interval [−80 Hz, 80 Hz], whereas the stop-band was within [−300 Hz, −140 Hz]. For a given flip angle, the water-to-fat signal ratio can be computed as a function of the parameter p and the value of p that yields the desired signal ratio can be chosen for reconstruction. FIG. 8 is a contour plot of the logarithm of the ratio of the average pass-band (±80 Hz) signal for water to the average stop-band (−220±80 Hz) signal for fat as a function of flip angle and the parameter p. TR/TE=2.3/1.15 ms, T1/T2=1000/100 ms for water and T1/T2=270/85 ms for fat was assumed for the simulations. The improvement in stop-band suppression as p is decreased can be seen as an increase in the signal ratio.

Figure 9A:
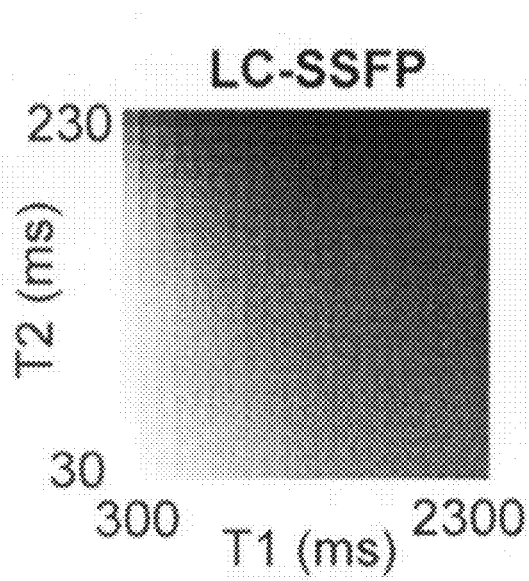
FIGS. 9A-D show the signal at the center of the pass-band for a range of T1 and T2 values.
Figure 9B:
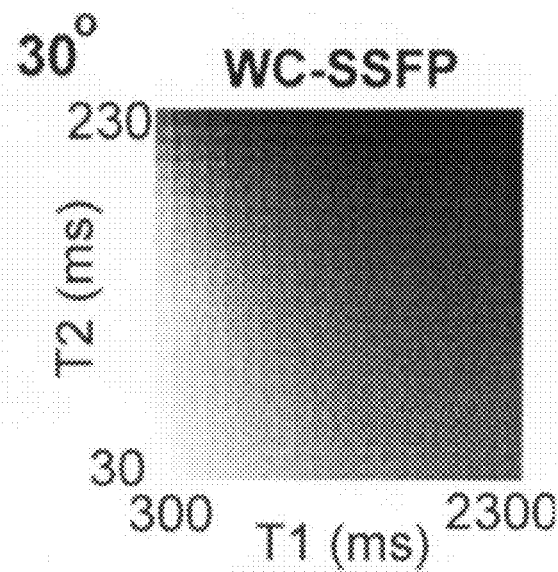
Figure 9C:
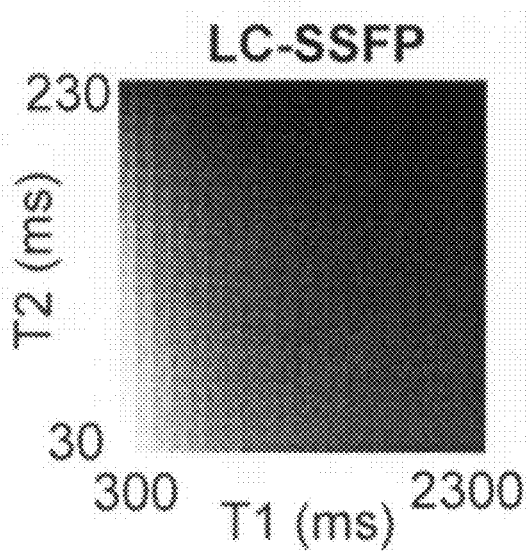
Figure 9D:
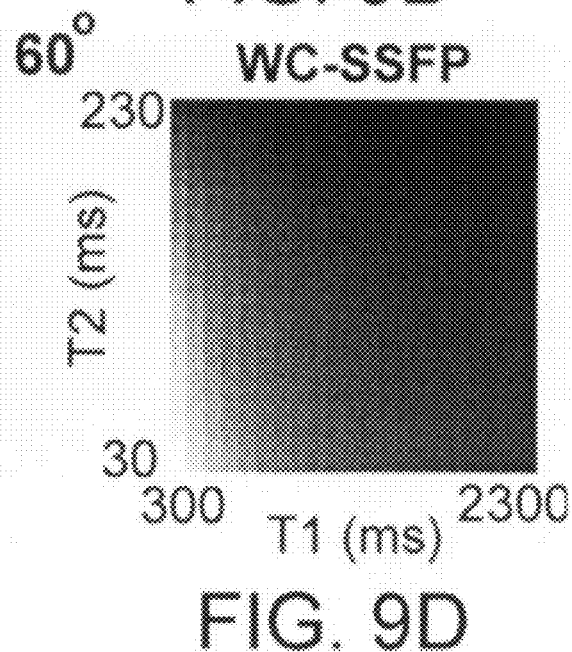

The effect of the magnitude-to-a-power weighting on the tissue contrast can be observed by simulating the SSFP signal at the center of the passband for a range of T1, T2 values. FIGS. 9A-D show the contrast of the LC-SSFP and WC-SSFP methods for 30° and 60° flip angles. The WC-SSFP method preserves the T2-dominant LC-SSFP contrast for which the contributions of T1 and T2 can be adjusted through varying the flip angle. Therefore, the magnitude-weighted combination does not alter the targeted tissue contrast. In FIGS. 9A-D the signal of spins that precess at the frequency corresponding to the center of the pass-band for TR=2.3 ms for a range of T1 and T2 values are displayed. The contrast variation of LC-SSFP is displayed for flip angles of 30° (FIG. 9A) and 60° (FIG. 9C). The contrast of the WC-SSFP (p=−0.5) method is also shown for 30° (FIG. 9B) and 60° (FIG. 9D). LC-SSFP and WC-SSFP have almost identical tissue contrast.

Figure 10A:
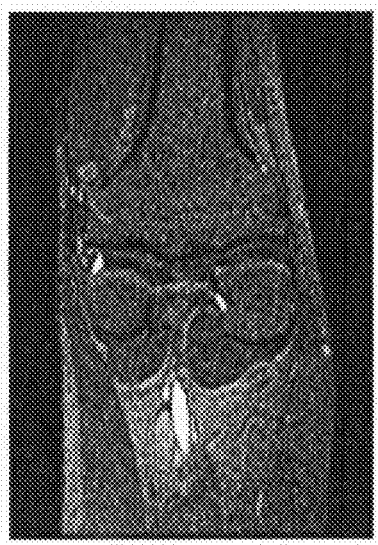
FIGS. 10A-F show 3DFT-SSFP images of a volunteer's knee acquired with the following parameters: TR=2.7 ms, 1 mm isotropic resolution, α=30°, 192×128×128 encoding, 250 kHz readout bandwidth and a total scan time of 1:18.
Figure 10B:
Figure 10C:
Figure 10D:
Figure 10E:
Figure 10F:

The improved stop-band suppression of the WC-SSFP method was also demonstrated in vivo. Two 3D SSFP acquisitions on a 1.5 T GE Signa Excite scanner with CV/i gradients were performed on a volunteer's knee with the following parameters: TR=2.7 ms, 1 mm isotropic resolution, α=30°, 192×128×128 encoding, 250 kHz bandwidth and a total scan time of 1:18. The coronal and sagittal slices of the knee are shown in FIGS. 10A-F. Coronal and sagittal slices are shown for LC-SSFP (FIGS. 10A, B) and WC-SSFP (p=−0.5) (FIGS. 10D, E) methods. The corresponding maximum-intensity projections (MIPs) in the R-L direction are shown in FIG. 10C and FIG. 10F, respectively. The vessel depiction in the MIP of the WC-SSFP image is clearly superior due to improved fat suppression.

There is residual fat signal in the LC-SSFP images, whereas the WC-SSFP method effectively suppresses the fat signal. At TR=2.7 ms the period of the SSFP spectrum is reduced and the separation between the stop- and pass-bands in LC-SSFP becomes smaller. If the center of the pass-band is aligned with the water-resonance, the fat-resonance will not exactly be aligned with the center of the stop-band. As a result the stop-band suppression robustness of LC-SSFP is reduced. On the other hand, WC-SSFP achieves robust suppression throughout the stop-band. The greater stop-band suppression with the WC-SSFP method manifests itself in the MIP with improved depiction of the vasculature.

It should be noted that the non-linearity of WC-SSFP combination leads to partial-volume effects due to the destructive interference between fat and water spins within the same voxel. This non-linearity becomes more pronounced asp approaches −1. However, for moderate values of |p|(≦0.5), partial-volume effects are not noticeable. Furthermore, partial-volume effects become less of an issue for high-resolution imaging. At lower resolutions the value of |p| should be chosen as small as possible, while still effectively suppressing the signal in the stop-band.

Fat-water separation comprising a summation of two SSFP data sets where fat and water are in-phase and out-of-phase has been proposed by Huang T Y, Chung H W, Wang F N, Ko C W, Chen C Y in "Fat And Water Separation In Balanced Steady-State Free Precession Using The Dixon Method," Magn Reson Med 2004 51:243-247. However, the method is hindered by imperfect signal cancellation caused by signal heterogeneity due to SSFP nulls. WC-SSFP can be adapted to address this shortcoming. Magnitude-to-a-power weighting of these SSFP signals prior to combination should improve the robustness of fat-water separation and extend the tolerable range of resonant frequency variation. Similarly, WC-SSFP combination can be applied to improve any multiple-acquisition SSFP method that suffers from signal inhomogeneity of the SSFP profile.

While this invention has been described in terms of several preferred embodiments, there are alterations, permutations, modifications and various substitute equivalents, which fall within the scope of this invention. It should also be noted that there are many alternative ways of implementing the methods and apparatuses of the present invention. It is therefore intended that the following appended claims be interpreted as including all such alterations, permutations, modifications, and various substitute equivalents as fall within the true spirit and scope of the present invention.

What is claimed is:

1. A method of providing selective spectral suppression in steady-state free procession (SSFP) magnetic resonance imaging, comprising:
   a) acquiring a plurality of SSFP images with different RF phase increments of an object to be imaged; and
   b) combining the plurality of SSFP images using a weighted combination in which the weights depend on a control parameter that adjusts a trade-off between selective spectral suppression and signal-to-noise ratio (SNR).

2. The method, as recited in claim 1, wherein the combining the plurality of SSFP images uses a weighted combination of complex-valued SSFP images in which the weighting is based on the SSFP images themselves and which a power of the weight is a function of the control parameter.

3. The method, as recited in claim 1, wherein the combining of the plurality of SSFP images uses a weighting according to the equations $$Y_1 = \||D_{0-0}|^p D_{0-0} + i|D_{0-180}|^p D_{0-180}\|^{\frac{1}{1+p}}$$

$$Y_2 = \||D_{0-0}|^p D_{0-0} - i|D_{0-180}|^p D_{0-180}\|^{\frac{1}{1+p}}$$

wherein $Y_1$ is an image for a first species and $Y_2$ is an image for a second species, $D_{0-0}$ is a data set of consecutive RF pulses that are all in phase and $D_{0-180}$ is a data set of consecutive RF pulses that are all out of phase and p is a real number in the range (−1, 0), where p is a control parameter.

4. The method, as recited in claim 3, further comprising displaying the combined plurality of SSFP images.

5. The method, as recited in claim 4, wherein the first species is water and the second species is fat.

6. The method, as recited in claim 5, further comprising repeatedly applying a sequence of RF excitation pulses with a phase progression which provides an SSFP image in which a spectrally dependent steady-state magnetization is established.

7. The method, as recited in claim 6, further comprising applying magnetic gradients between said RF excitation pulses.

8. The method, as recited in claim 1, further comprising displaying the combined plurality of SSFP images.

9. The method, as recited in claim 8, further comprising repeatedly applying a sequence of RF excitation pulses with a phase progression which provides an SSFP image in which a spectrally dependent steady-state magnetization is established.

10. The method, as recited in claim 9, further comprising applying magnetic gradients between said RF excitation pulses.

11. The method, as recited in claim 1, wherein the combining the plurality of SSFP images uses a weighted combination of complex-valued SSFP images in which the weighting is based on the SSFP images themselves and which a power of the weight is a function of the control parameter and further comprising displaying the combined plurality of SSFP images.

12. The method, as recited in claim 11, further comprising repeatedly applying a sequence of RF excitation pulses with a phase progression, which provides an SSFP image in which a spectrally dependent steady-state magnetization is established.

13. The method, as recited in claim 12, further comprising applying magnetic gradients between said RF excitation pulses.

14. A method, comprising:
a) repeatedly applying a sequence of RF excitation pulses with a phase progression, which provides an SSFP image in which a spectrally dependent steady-state magnetization is established;
b) applying magnetic gradients between said RF excitation pulses;
c) acquiring a plurality of suppression in steady-state free procession SSFP images with different RF phase increments of an object to be imaged; and
d) combining the plurality of SSFP images using a weighted combination using a weighting according to the equations $$Y_1 = \||D_{0-0}|^p D_{0-0} + i|D_{0-180}|^p D_{0-180}\|^{\frac{1}{1+p}}$$

$$Y_2 = \||D_{0-0}|^p D_{0-0} - i|D_{0-180}|^p D_{0-180}\|^{\frac{1}{1+p}}$$

wherein $Y_1$ is an image for a first species and $Y_2$ is an image for a second species, $D_{0-0}$ data set based on consecutive RF pulses that are all in phase and $D_{0-180}$ is a data set based on consecutive RF pulses that are all out of phase and p is a real number in the range (−1, 0), where p is a control parameter;
e) displaying the combined plurality of SSFP images.

15. The method, as recited in claim 14, wherein the first species is water and the second species is fat.

16. An apparatus, comprising:
a magnet system;
a controller electrically connected to the magnet system, comprising:
a display;
at least one processor; and
computer readable media, comprising:
computer readable code for acquiring a plurality of SSFP images with different RF phase increments of an object to be imaged; and
computer readable code for combining the plurality of SSFP images using a weighted combination in which the weights depend on a control parameter that adjusts a trade-off between selective spectral suppression and signal-to-noise ratio (SNR).

17. The apparatus, as recited in claim 16, wherein the computer readable code for combining the plurality of SSFP images uses a weighted combination of complex-valued SSFP images in which the weighting is based on the SSFP images themselves and which a power of the weight is a function of the control parameter p.

18. The apparatus, as recited in claim 16, wherein the computer readable code for combining of the plurality of SSFP images uses a weighting according to the equations $$Y_1 = \||D_{0-0}|^p D_{0-0} + i|D_{0-180}|^p D_{0-180}\|^{\frac{1}{1+p}}$$

$$Y_2 = \||D_{0-0}|^p D_{0-0} - i|D_{0-180}|^p D_{0-180}\|^{\frac{1}{1+p}}$$

wherein $Y_1$ is an image for a first species and $Y_2$ is an image for a second species, $D_{0-0}$ is a data set of consecutive RF pulses that are all in phase and $D_{0-180}$ is a data set of consecutive RF pulses that are all out of phase and p is a real number in the range (−1, 0), where p is a control parameter.

19. The apparatus, as recited in claim 18, further comprising computer readable code for displaying the combined plurality of SSFP images.

* * * * *